(12) United States Patent
Hasegawa et al.

(10) Patent No.: US 8,193,453 B2
(45) Date of Patent: Jun. 5, 2012

(54) ELECTRONIC APPARATUS AND PRINTED WIRING BOARD

(75) Inventors: Kenji Hasegawa, Hamura (JP); Tsuyoshi Kozai, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 336 days.

(21) Appl. No.: 12/470,400

(22) Filed: May 21, 2009

(65) Prior Publication Data
US 2010/0059264 A1    Mar. 11, 2010

(30) Foreign Application Priority Data
Sep. 10, 2008    (JP) ................................ 2008-232392

(51) Int. Cl.
*H05K 1/02*    (2006.01)
(52) U.S. Cl. ........................................ 174/255; 174/262
(58) Field of Classification Search .................... 174/255
See application file for complete search history.

(56) References Cited

U.S. PATENT DOCUMENTS

| | | | |
|---|---|---|---|
| 2,750,848 A * | 6/1956 | Boyer ............................. | 89/137 |
| 3,883,305 A * | 5/1975 | Hoskins et al. ................. | 422/65 |
| 4,400,594 A * | 8/1983 | Serras-Paulet ................. | 200/5 A |
| 4,851,614 A | 7/1989 | Duncan, Jr. | |
| 5,064,377 A * | 11/1991 | Wood .............................. | 439/67 |
| 5,326,937 A | 7/1994 | Watanabe | |
| 5,414,223 A | 5/1995 | Suski et al. | |
| 5,420,378 A | 5/1995 | Estes et al. | |
| 5,483,418 A | 1/1996 | Hosoi | |
| 5,500,789 A | 3/1996 | Miller et al. | |
| 6,011,699 A * | 1/2000 | Murray et al. ................ | 361/814 |
| 6,248,961 B1 | 6/2001 | Enroth et al. | |
| 6,295,210 B1 * | 9/2001 | Lanzone et al. .............. | 361/799 |
| 6,706,964 B2 | 3/2004 | Igarashi et al. | |
| 6,894,220 B1 | 5/2005 | Kozak et al. | |
| 7,088,591 B2 | 8/2006 | Kishimoto et al. | |
| 7,310,236 B2 * | 12/2007 | Takahashi et al. ............ | 361/757 |
| 7,529,104 B2 | 5/2009 | Ito | |
| 7,898,820 B2 | 3/2011 | Kao et al. | |
| 7,965,517 B2 | 6/2011 | Mayumi et al. | |
| 2006/0021793 A1* | 2/2006 | Aoki ............................. | 174/260 |

(Continued)

FOREIGN PATENT DOCUMENTS
JP    U 60-151161    10/1985
(Continued)

OTHER PUBLICATIONS

Notification of Reasons for Rejection mailed by JPO in the corresponding to the Japanese Patent Application No. 2008-232392 on Aug. 11, 2009.

(Continued)

*Primary Examiner* — Timohty Thompson
*Assistant Examiner* — Hiram E Gonzalez
(74) *Attorney, Agent, or Firm* — Knobbe, Martens, Olson & Bear, LLP (57) ABSTRACT

According to an aspect of the present invention, there is provided a printed wiring board including: a substrate including a pair of edges and a fixing hole adjacent to the pair of edges and configured to receive a bolt; a land provided in a vicinity of the fixing hole and extending in a direction from the fixing hole toward a center of the substrate and along the pair of edges; and an insulating height adjuster provided between the fixing hole and the pair of edges and configured to have substantially the same height as the land.

14 Claims, 7 Drawing Sheets

U.S. PATENT DOCUMENTS

2007/0171136 A1* 7/2007 Mitsui .......................... 343/702
2011/0033813 A1* 2/2011 Baughman et al. ............. 433/18

FOREIGN PATENT DOCUMENTS

| JP | 62-14497 | 1/1987 |
| JP | 02-010791 | 1/1990 |
| JP | 03-175698 | 7/1991 |
| JP | U 04-15865 | 2/1992 |
| JP | 05-283823 | 10/1993 |
| JP | 10-270811 | 10/1998 |
| JP | 10-313154 | 11/1998 |
| JP | 11-317570 | 11/1999 |
| JP | 2000-244080 | 9/2000 |
| JP | 2000-349420 | 12/2000 |
| JP | 2003-309333 | 10/2003 |
| JP | 2006-041409 | 2/2006 |

OTHER PUBLICATIONS

Explanation of Non-English Language Reference(s), May 21, 2009.
U.S. Appl. No. 13/032,546, filed Feb. 22, 2011, *Electronic Apparatus and Printed Wiring Board*.
Notification of Reasons for Refusal mailed by Japan Patent Office on Aug. 11, 2009 in the corresponding Japanese patent application No. 2008-232390.
Notification of Reasons for Refusal mailed by Japan Patent Office on Nov. 10, 2009 in the corresponding Japanese patent application No. 2008-232390.
Explanation of Non-English Language Reference(s), Apr. 22, 2009.

* cited by examiner

ELECTRONIC APPARATUS AND PRINTED WIRING BOARD

CROSS-REFERENCE TO RELATED APPLICATIONS

This application is based upon and claims the benefit of priority from Japanese Patent Application No. 2008-232392, filed on Sep. 10, 2008, the entire contents of which are incorporated herein by reference.

BACKGROUND

1. Field

An aspect of the present invention relates to a printed wiring board having a land and an electronic apparatus having the printed wiring board.

2. Description of the Related Art

For example, a printed wiring board in which a land for grounding is provided around a fixing hole for bolting the printed wiring board is disclosed. This printed wiring board comprises a substrate, a fixing hole provided to penetrate through the substrate, a land provided in doughnut shaped around the fixing hole in a surface of the substrate, and a solder cream printed on the surface of the land.

In printed wiring boards of this type, usually, the surfaces of the lands are subjected to solder plating to prevent corrosion of the lands and attain reliable grounding. A printed wiring board having a cost advantage over ones in which the lands are subjected to solder plating is provided by supplying solder also to the land surfaces when cream solder is supplied to mounting patterns of other components (see JP-A-2000-244080, for instance).

In recent years, with the increase in miniaturization and functionality of digital equipment, the high-density mounting on a printed wiring board and the securing of a wide mounting area have come to be required increasingly. However, the above donut-shaped lands raise a problem that the mounting area on the printed wiring board is reduced by areas corresponding to the spaces for formation of the lands. For another thing, to secure a wide mounting area on a printed wiring board, it is effective to locate the fixing holes as close to the outer periphery of the board as possible. However, in the printed wiring boards, the fixing holes cannot be located sufficiently close to the outer periphery because margins for formation of the donut-shaped lands need to be secured around the respective fixing holes.

Each of these margins needs to be set taking into consideration not only the space for formation of the land but also a variation that may occur when a land pattern is formed by etching. This is because if a land is formed in contact with the periphery the land is exposed in an end face of the printed wiring board, as a result of which the printed wiring board may be short-circuited with another component. This also requires sufficient margins around the respective fixing holes.

On the other hand, one method for reducing the above margins is to narrow the widths of the donut-shaped lands. However, if the land widths are narrowed, a land pattern may be disconnected due to a variation in forming the pattern. Furthermore, since the lands are reduced in strength, the land patterns are prone to peel off when bolting is performed through the fixing holes. Further, since the land is a part for grounding on the casing, a contact area between the land and the bolt is narrowed if the width of the land is made smaller, possibly resulting in the lower reliability of the grounding.

For the above reasons, the printed wiring boards cannot sufficiently satisfy the recent requirements of high-density mounting and securing of a wider mounting area.

SUMMARY

According to an aspect of the invention, there is provided a printed wiring board including: a substrate including a pair of edges and a fixing hole adjacent to the pair of edges and configured to receive a bolt; a land provided in a vicinity of the fixing hole and extending in a direction from the fixing hole toward a center of the substrate and along the pair of edges; and an insulating height adjuster provided between the fixing hole and the pair of edges and configured to have substantially the same height as the land.

BRIEF DESCRIPTION OF THE SEVERAL VIEWS OF THE DRAWINGS

A general architecture that implements the various feature of the present invention will now be described with reference to the drawings. The drawings and the associated descriptions are provided to illustrate embodiments of the present invention and not to limit the scope of the present invention.

DETAILED DESCRIPTION

Figure 1:
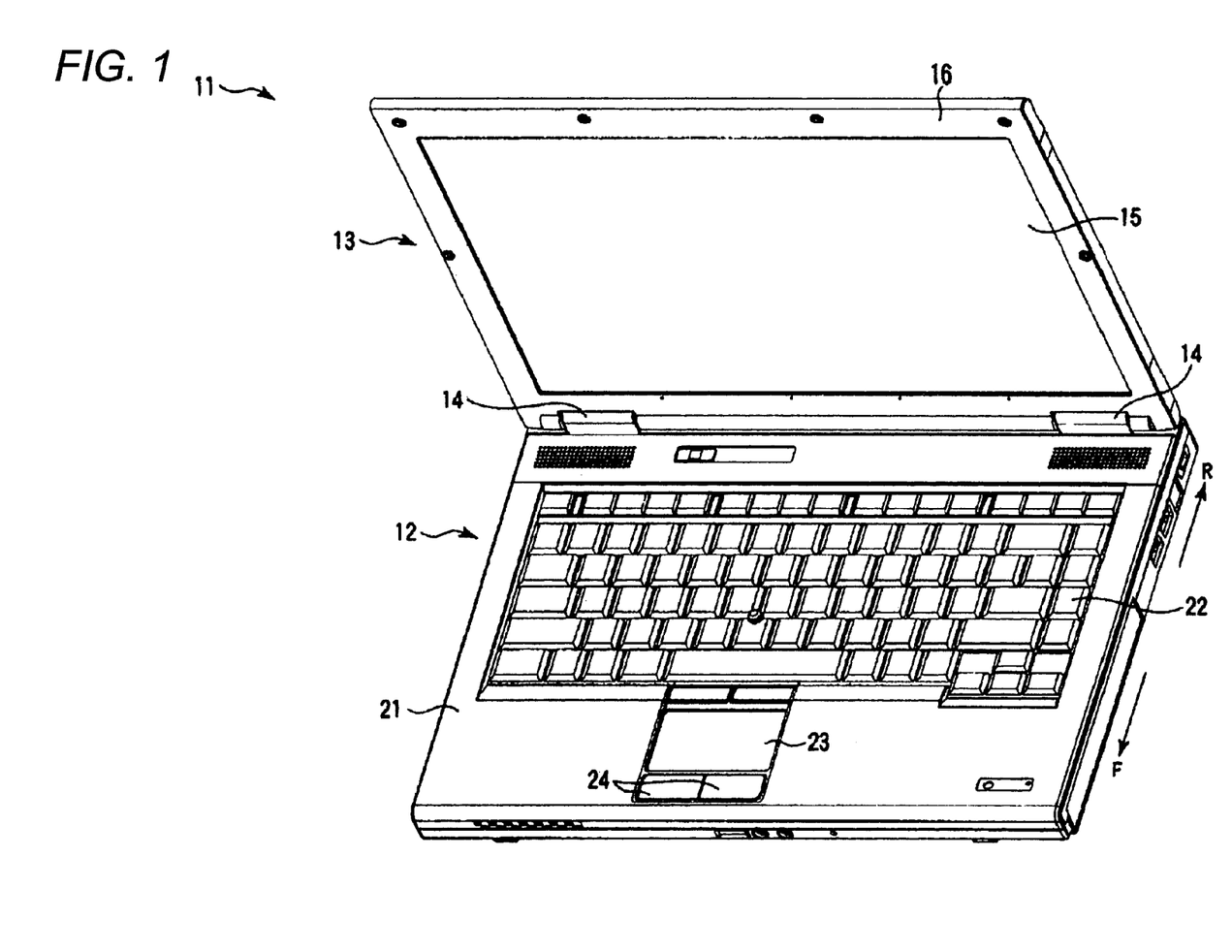
FIG. 1 is an exemplary perspective view of a portable computer according to a first embodiment.
Figure 2:
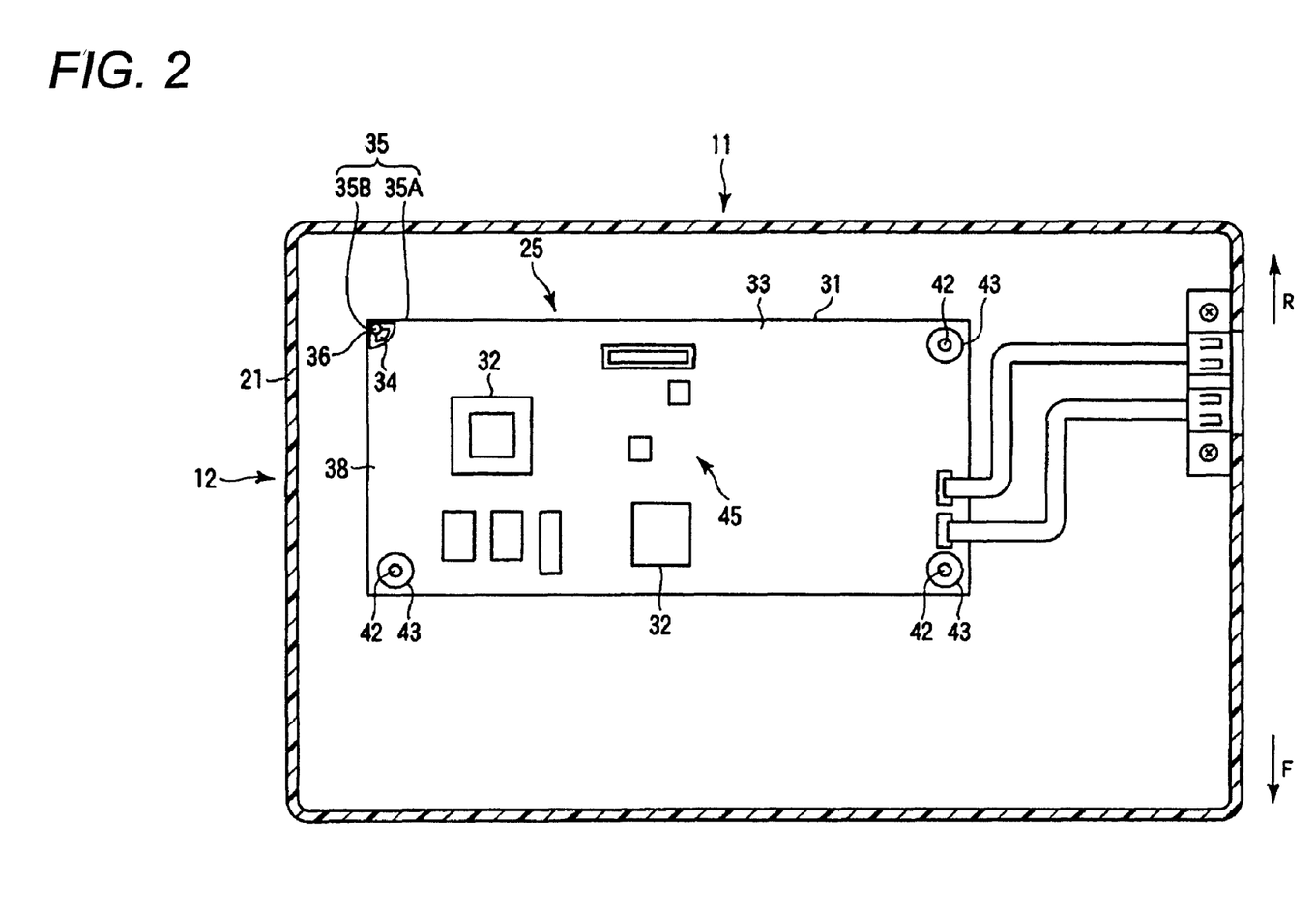
FIG. 2 is an exemplary sectional view along the horizontal direction of a main body unit of the portable computer as shown in FIG. 1.

With reference to FIGS. 1 to 4, a first embodiment of an electronic apparatus will be described below. A portable computer as one example of the electronic apparatus is a so-called notebook personal computer, as shown in FIG. 1. In FIGS. 1 and 2, a description will be made with a notation that the forward direction and the backward direction are denoted by arrows F and R, respectively.

The portable computer 11 is equipped with a main body unit 12, a display unit 13, and hinge mechanisms 14 which connect the main body unit 12 and the display unit 13, as shown in FIG. 1. Supporting the display unit 13, the hinge mechanisms 14 make it possible to rotate the display unit 13 with respect to the main body unit 12. The display unit 13 has a display 15 and a cover 16 surrounding the display 15. The display 15 is a liquid crystal display, for example.

Figure 4:
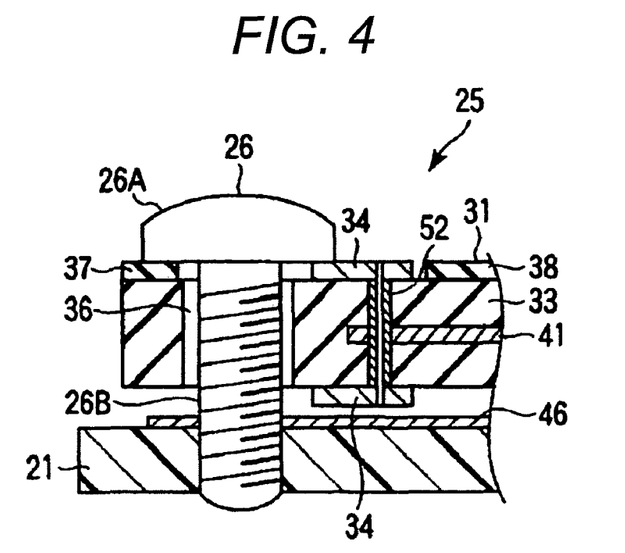
FIG. 4 is an exemplary sectional view along the longitudinal direction of the printed wiring board as shown in FIG. 3.

The main body unit 12 has a casing 21 made of synthetic resin, a keyboard 22, and a touch pad 23 and a button 24 that are a pointing device. The main body unit 12 further has, inside the casing 21, a printed circuit board 25 and bolts 26 for fixing the printed circuit board 25 on the casing 21, as shown in FIGS. 2 and 4. The printed circuit board 25 has a printed wiring board 31 and a plurality of circuit components 32 mounted on the printed wiring board 31. The plural circuit components 32 include a CPU and a north bridge, for example. In FIG. 2, the bolts 26 are not illustrated. The inside surfaces of the casing 21 are uniformly covered with a conductive ground layer 46. The ground layer 46 prevents outward leakage of electromagnetic waves from the portable computer 11.

Figure 3:
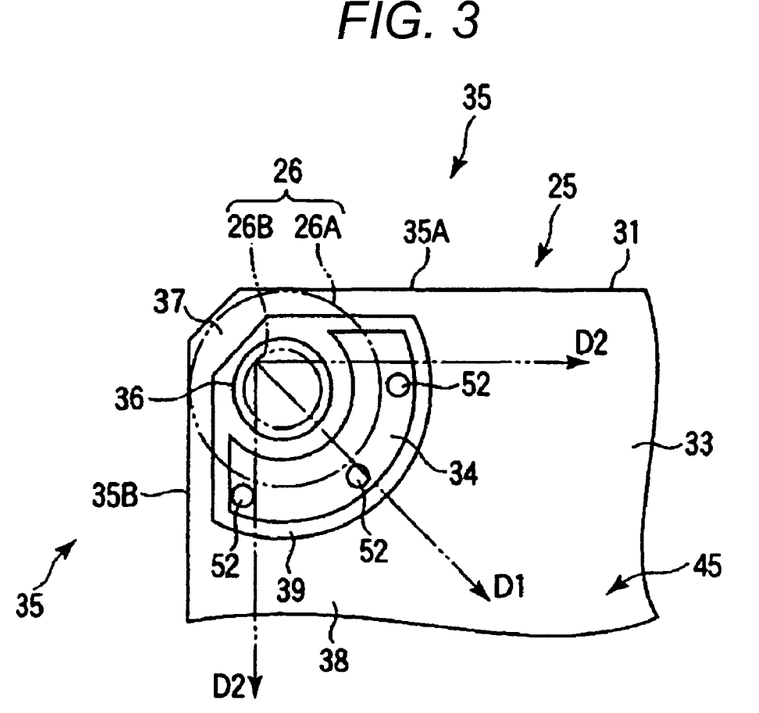
FIG. 3 is an exemplary enlarged plan view showing a part of a printed wiring board contained inside a casing of the main body unit as shown in FIG. 2.

For example, the printed wiring board 31 is a copper-clad lamination plate in which a plurality of copper wiring layers are laminated, for example. The printed wiring board 31 has a substrate 33, a land 34 and a height adjuster 37 provided on the substrate 33, a solder resist layer 38 covering the surface of the substrate 33, and a through hole plating 52 for electrically connecting the land 34 with a ground portion 41. The substrate 33 is formed by alternately laminating insulating layers made of a glass-cloth-incorporated resin and wiring layers sandwiched between the insulating layers. The substrate 33 has a first edge 35A and a second edge 35B that are a pair of edges defining a part of the outer periphery of the substrate 33, and a fixing hole 36 provided at a position adjacent to the first edge 35A and the second edge 35B. The fixing hole 36 is disposed closer to the first edge 35A and the second edge 35B.

The ground portion 41 is grounded to the ground layer 46 via the through hole plating 52, the land 34 and the bolt 26, as shown in FIGS. 3 and 4.

The substrate 33 further has through holes 42 for bolting the printed wiring board 31 on the casing 21, in addition to the fixing hole 36, as shown in FIGS. 2 to 4. A second land 43 of the conventional shape, namely, a doughnut shape is formed around the through hole 42. When the printed circuit wiring 31 is fixed to the casing 21, the bolts 26 are inserted through the fixing hole 36 and the through-holes 42.

The bolt 26 has a head portion 26A covering the land 34 or the second land 43 and contacted by the land 34 or the second land 43, and a shank portion 26B passed through the fixing hole 36 or the through hole 42. An external thread is formed on the outer periphery of the shank portion 26B.

The land 34 is provided at a position around the fixing hole 36 and in a vicinity of the fixing hole 36. The land 34 extends from the fixing hole 36 in the range between the direction D1 from the fixing hole 36 to a central portion 45 of the substrate 33 and the direction D2 along the direction where one pair of edges 35A and 35B extend. That is, the land 34 is shaped like a sector around the fixing hole 36, and located to extend toward the central portion 45 of the substrate 33. An angle of the sector shape of the land 34 in this embodiment is about 90 degrees, for example. The land 34 is formed in the shape of the sector by etching a copper foil on the surface layer of the substrate 33, for example.

The height adjuster 37 is formed of a solder resist, for example, and has the insulating property. The height adjuster 37 is formed to be continuous to the solder resist layer 38 covered on the surface of the substrate 33. The height adjuster 37 is provided between the fixing hole 36 and a pair of edges 35A and 35B. More specifically, the height adjuster 37 is disposed like a band along the edges 35. The height adjuster 37 has the same height as the upper surface of the land 34. The height adjuster 37 and the solder resist layer 38 are formed by printing (screen printing) a solder resist on the surface of the substrate 33, after forming the land 34 by etching. A gap 39 is provided between the solder resist layer 38 and the height adjuster 37 and the land 34. Though the solder resist layer 38 and the height adjuster 37 may be misregistered and printed on the substrate 33, this gap 39 prevents the solder resist layer 38 and the height adjuster 37 misregistered from being formed over the land 34.

Though in this embodiment, a plurality of through holes 42 are provided, and one fixing hole 36 is provided, it should be noted that a plurality of fixing holes 36 may be provided instead of the through holes 42. Also, the height adjuster 37 is formed of solder resist in this embodiment, but not limited thereto. It should be noted that the height adjuster 37 may be anything having the insulating property, and may be formed of silk printed on the surface of the substrate 33, for example. Also, though no plating is applied on the inside surface of the fixing hole 36 in this embodiment, the fixing hole may be formed as a through hole by coating the plating on the inside surface of the fixing hole 36.

According to the first embodiment, the portable computer 11 comprises the casing 21 having the conductive ground layer 46 on the inside surface, the printed wiring board 31 contained inside the casing 21, and the bolt 26 for fixing the printed wiring board 31 on the casing 21 and grounding the printed wiring board 31 to the ground layer 46, wherein the printed wiring board 31 has the substrate 33 having a pair of edges 35A and 35B defining a part of the outer periphery and the fixing hole 36 provided at a position adjacent to the pair of edges 35A and 35B and passing the bolt 26 through it, the land 34 provided in the vicinity of the fixing hole 36 and extended from the fixing hole 36 in the range between the direction D1 from the fixing hole 36 to the central portion 45 of the substrate 33 and the direction D2 along the direction where the pair of edges 35A and 35B extend, and the insulating height adjuster 37 provided at a position between the fixing hole 36 and the pair of edges 35A and 35B and having the same height as the land 34.

With this configuration, the land 34 is formed in the direction D1 toward the central part 45 of the substrate 33, and the land 34 is not formed between the fixing hole 36 and the edges 35. Thereby, space for disposing the land 34 at the position between the fixing hole 36 and the edges 35 is unnecessary, whereby the fixing hole 36 can be disposed as close to the edges 35 as possible. Therefore, it is possible to secure a wide mounting area on the printed wiring board 31. Also, since the height adjuster 37 having the same height as the land 34 is provided, the bolt 26 is not inclined and installed in fixing the printed wiring board 31 by fastening the bolt 26 into the fixing hole 36. Therefore, the bolt 26 is not suspended over the land 34, whereby the printed wiring board 31 can be securely grounded.

In this embodiment, the land 34 is shaped like the sector extended toward the central portion 45 around the fixing hole 36. With this configuration, the land 34 having enough strength can be realized in a simple shape. Particularly, because the shape of the land 34 is the sector, the head portion 26A of the bolt 26 easily contacts the land 34, making it possible to securely ground the printed wiring board 31 to the ground layer 46 of the casing 21.

Figure 5:
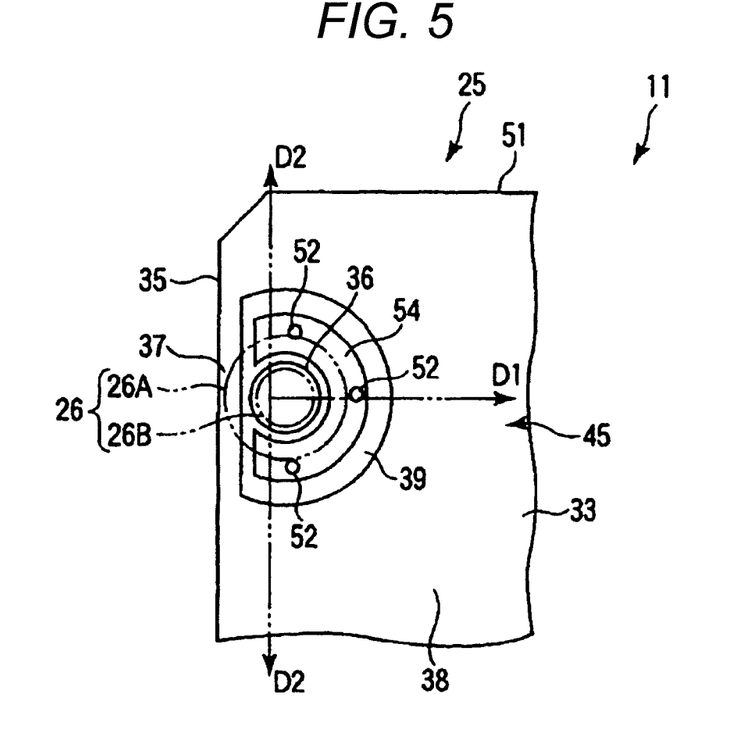
FIG. 5 is an exemplary enlarged plan view showing a part of a printed wiring board of a portable computer according to a second embodiment.

Referring to FIG. 5, a second embodiment of the portable computer will be described below. The portable computer 11 that is one example of the electronic apparatus according to the second embodiment is different from the first embodiment in that the fixing hole 36 is provided in the vicinity of an edge 35, and the shape of a land 54 is different, but the other portions are common. Therefore, the different portions from the first embodiment will be mainly described below, in which the common portions are designated by the common numerals, and the explanation thereof is omitted.

A printed wiring board 51 for the portable computer 11 of the second embodiment has the substrate 33, the land 54 and the height adjuster 37 provided on the substrate 33, the solder resist layer 38 covering the surface of the substrate 33, and a through hole plating 52 for electrically connecting the land 54 and the ground portion 41.

The substrate 33 has the edge 35 defining a part of the outer periphery of the substrate 33, and the fixing hole 36 provided at a position adjacent to this edge 35. The fixing hole 36 is disposed closer to the edge 35.

The land 54 is provided around the fixing hole 36 and in the vicinity of the fixing hole 36. The land 54 extends from the fixing hole 36 in the range between the direction D1 from the fixing hole 36 to a central portion 45 of the substrate 33 and the direction D2 along the direction where the edge 35 extends. The land 54 is shaped like a sector around the fixing hole 36, and located to extend toward the central portion 45 of the substrate 33. An angle of the sector shape of the land 54 in this embodiment is about 180 degrees, for example.

The height adjuster 37 is formed of solder resist, for example, and has an insulating property. The height adjuster 37 is formed to be continuous to the solder resist layer 38 covered on the surface of the substrate 33. The height adjuster 37 is provided at a position between the fixing hole 36 and the edge 35, and located like a band along the edge 35. The height adjuster 37 has the same height as the upper surface of the land 54. The height adjuster 37 and the solder resist layer 38 are formed by printing (screen printing) a solder resist on the surface of the substrate 33, after forming the land 54 by etching. A gap 39 is provided between the solder resist layer 38 and the height adjuster 37 and the land 54. The height adjuster 37 may be formed of silk, like the first embodiment.

With the second embodiment, even though the fixing hole 36 is provided in the vicinity of the edge 35, the land 34 is formed in the direction D1 toward the central portion 45 of the substrate 33, and the land 34 is not formed between the fixing hole 36 and the edge 35. Hence, the fixing hole 36 can be disposed as close to the edge 35 as possible, whereby it is possible to secure a wide mounting area on the printed wiring board 31. Also, since the height adjuster 37 having the same height as the land 34 is provided, the bolt 26 is not inclined and installed in fixing the printed wiring board 51 by fastening the bolt 26 into the fixing hole 36. Therefore, the printed wiring board 51 can be securely grounded.

Figure 6:
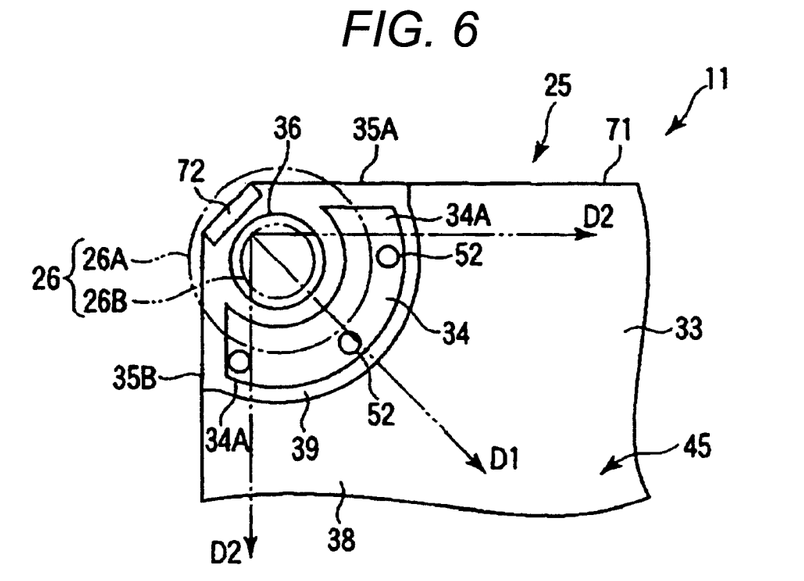
FIG. 6 is an exemplary enlarged plan view showing a part of a printed wiring board of a portable computer according to a third embodiment.

Referring to FIG. 6, a third embodiment of the portable computer will be described below. The portable computer 11 that is one example of the electronic apparatus of the third embodiment is different from the first embodiment in the configuration of a height adjuster 72 in a printed wiring board 71, and the installed positions of the fixing hole 36 and the land 34, but the other portions are common. Therefore, the different portions from the first embodiment will be mainly described below, in which the common portions are designated by the common numerals, and the explanation thereof is omitted.

The printed wiring board 71 for the portable computer 11 of the third embodiment has the substrate 33, the land 34 and the height adjuster 72 provided on the substrate 33, the solder resist layer 38 covering the surface of the substrate 33, and the through hole plating 52 for electrically connecting the land 54 and the ground portion 41.

The substrate 33 has the first edge 35A and the second edge 35B that are a pair of edges defining a part of the outer periphery of the substrate 33, and the fixing hole 36 provided at a position adjacent to the first edge 35A and the second edge 35B. The fixing hole 36 is disposed as close to one edge 35 as possible.

The land 34 is provided at a position around the fixing hole 36 and in the vicinity of the fixing hole 36. The land 34 extends from the fixing hole 36 in the range between the direction D1 from the fixing hole to a central portion 45 of the substrate 33 and the direction D2 along the direction where the edges 35 extend. The land 34 is shaped like a sector, and located to extend toward the central portion 45 of the substrate 33. An angle of the sector shape of the land 34 in this embodiment is about 90 degrees, for example.

The height adjuster 72 is formed of solder resist, for example, and has an insulating property. The height adjuster 72 is formed independently of the solder resist layer 38 covered on the surface of the substrate 33. The height adjuster 72 is provided between the fixing hole 36 and one edge 35, but located outside the region between the edge 35 and a part 34A of the land 34 opposed to the edge 35. The height adjuster 72 is located at a position where a pair of edges 35A and 35B intersect, namely, at a corner portion of the printed wiring board 71.

The height adjuster 72 has the same height as the upper surface of the land 34. The height adjuster 72 and the solder resist layer 38 are formed by printing (screen printing) a solder resist on the surface of the substrate 33, after forming the land 34 by etching. A gap 39 is provided between the solder resist layer 38 and the land 34. Even if the height adjuster 72 is formed separately from the solder resist layer 38 as in this embodiment, the manufacturing process is not complicated.

With the third embodiment, the height adjuster 72 is disposed at outside the region between the edge 35 and the part 34A of the land 34 opposed to the edge 35, where one pair of edges 35A and 35B intersect. With this configuration, the height adjuster 72 is disposed not at the position between the edge 35 and the part 34A of the land 34 opposed to the edge 35, but at the so-called corner portion of the printed wiring board 71. Therefore, the space for requiring the installation of the height adjuster 72 is smaller than in the first embodiment, whereby the fixing hole 36 and the land 34 can be disposed closer to the corner portion of the printed wiring board 71 to locate a part of the land 34 in the empty space. Thereby, it is possible to secure a wider mounting space on the printed wiring board 71 than in the first embodiment.

Figure 7:
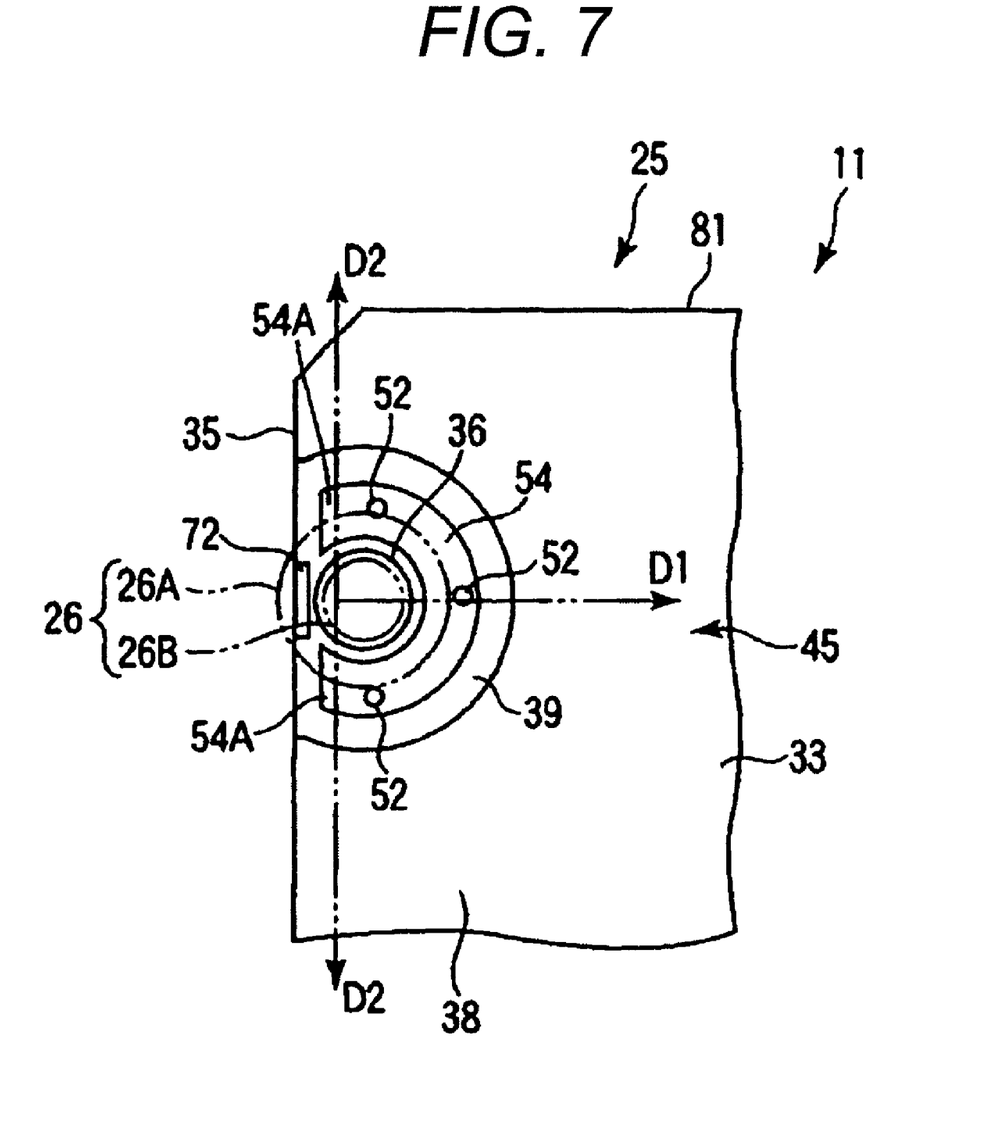
FIG. 7 is an exemplary enlarged plan view showing a part of a printed wiring board of a portable computer according to a fourth embodiment.

Referring to FIG. 7, a fourth embodiment of the portable computer will be described below. The portable computer 11 that is one example of the electronic apparatus of the fourth embodiment is different from the second embodiment in the configuration of the height adjuster 72 for a printed wiring board 81 and the installed positions of the fixing hole 36 and the land 54, but the other portions are common. Therefore, the different portions from the second embodiment will be mainly described below, in which the common portions are designated by the common numerals, and the explanation thereof is omitted.

The printed wiring board 81 for the portable computer 11 of the forth embodiment has the substrate 33, the land 54 and the height adjuster 72 provided on the substrate 33, the solder resist layer 38 covering the surface of the substrate 33, and the through hole plating 52 for electrically connecting the land 54 and the ground portion 41.

The substrate 33 has one edge 35 defining a part of the outer periphery of the substrate 33, and the fixing hole 36 provided at a position adjacent to one edge 35. The fixing hole 36 is disposed as close to one edge 35 as possible.

The land 54 is provided at a position around the fixing hole 36 and in the vicinity of the fixing hole 36. The land 54 extends from the fixing hole 36 in the range between the direction D1 from the fixing hole 36 to a central portion 45 of the substrate 33 and the direction D2 along the direction where the edge 35 extends. The land 54 is shaped like a sector, and located to extend toward the central portion 45 of the substrate 33. The angle of the sector shape of the land 54 in this embodiment is about 180 degrees, for example.

The height adjuster 72 is formed of solder resist, for example, and has an insulating property. The height adjuster 72 is formed independently of the solder resist layer 38 covered on the surface of the substrate 33. The height adjuster 72 is provided between the fixing hole 36 and one edge 35, but located outside the region between the edge 35 and a part 54A of the land 54 opposed to the edge 35. That is, the height adjuster 72 is provided only in the vicinity of some of one edge 35 diametrically opposed to the fixing hole 36.

The height adjuster 72 has the same height as the upper surface of the land 54. The height adjuster 72 and the solder resist layer 38 are formed by printing (screen printing) a solder resist on the surface of the substrate 33, after forming the land 54 by etching. A gap 39 is provided between the solder resist layer 38 and the height adjuster 72 and the land 54. Even if the height adjuster 72 is formed separately from the solder resist layer 38 as in this embodiment, the manufacturing process is not complicated.

With the fourth embodiment, the height adjuster 72 is disposed outside the region between the edge 35 and the part 54A of the land 54 opposed to the edge 35. With this configuration, the space for requiring the installation of the height adjuster 72 is smaller than in the first embodiment, whereby the fixing hole 36 and the land 34 can be disposed closer to the edge 35 of the printed wiring board 81 to locate a part of the land 54 in the empty space. Thereby, it is possible to secure a wider mounting space on the printed wiring board 81 than in the second embodiment.

Figure 8:
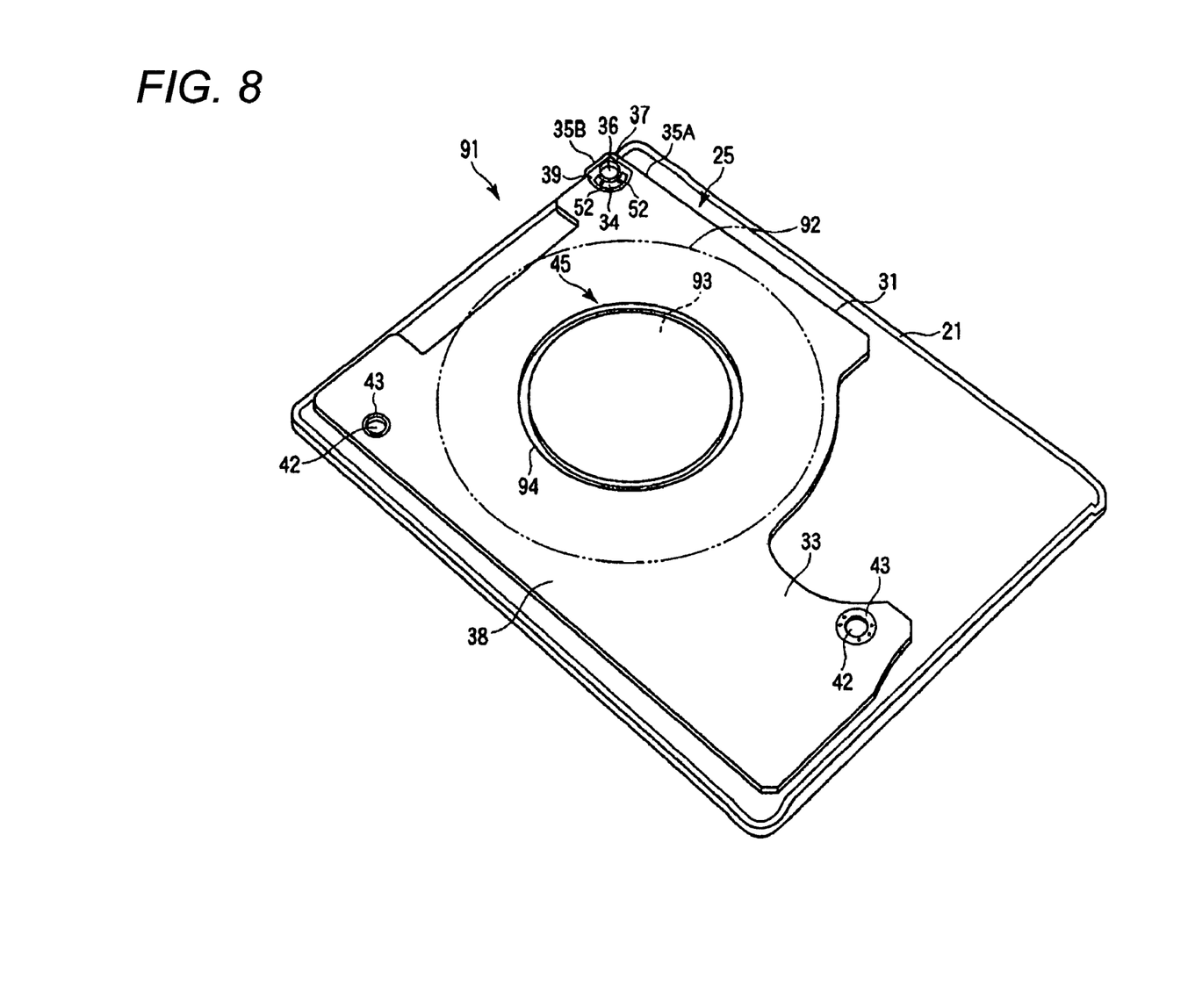
FIG. 8 is an exemplary perspective view showing a printed wiring board contained inside the casing of a hard disk device according to a fifth embodiment.
Figure 9:
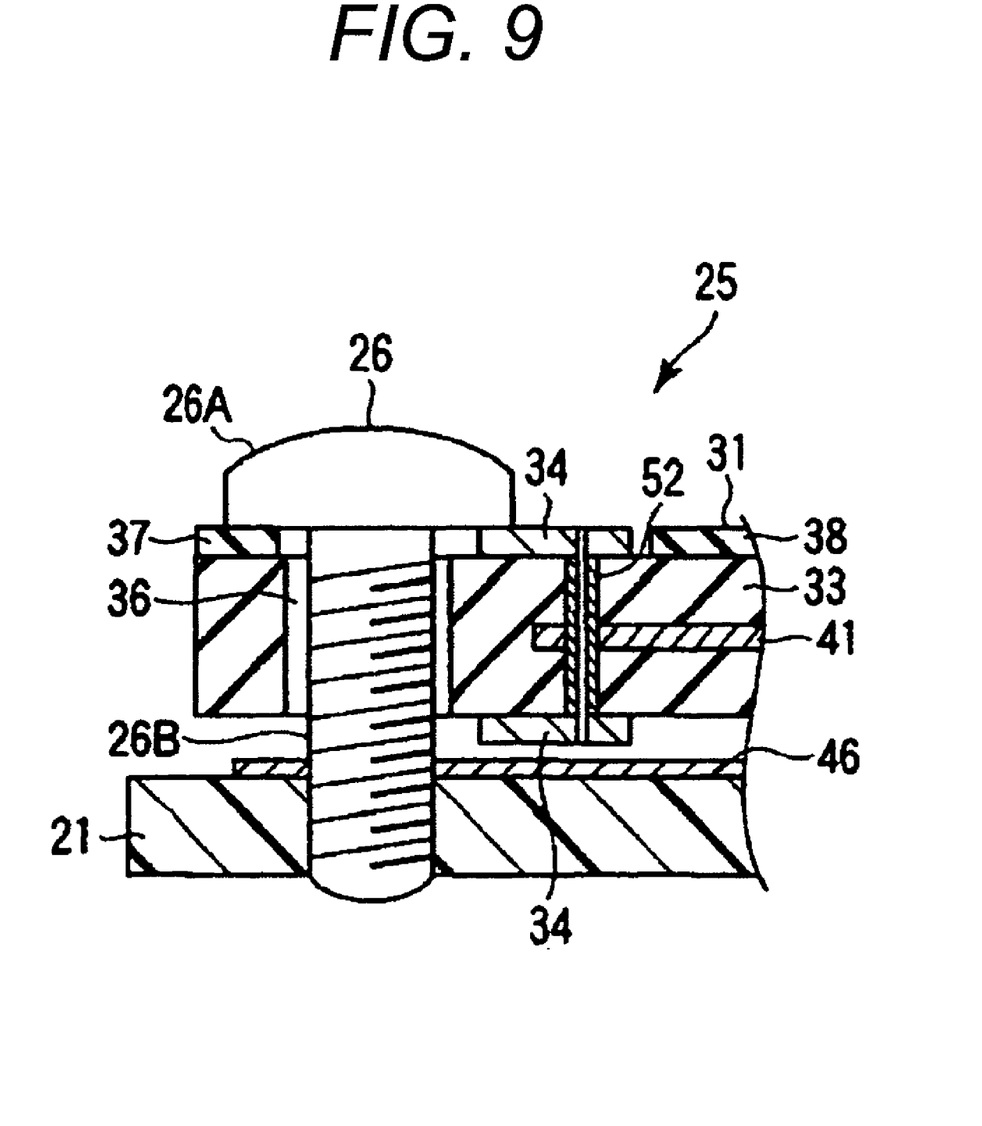
FIG. 9 is an exemplary sectional view along the longitudinal direction of the printed wiring board as shown in FIG. 8.

Referring to FIGS. 8 and 9, a fifth embodiment of the electronic apparatus will be described below. In the fifth embodiment, the invention is applied to a hard disk device 91 as one example of the electronic apparatus. The hard disk device 91 as one example of the electronic apparatus is different in the configuration of each part from the first to fourth embodiments, but substantially common in the configuration of the printed wiring board 31 to the first embodiment. Therefore, the different portions from the second embodiment will be mainly described below, in which the common parts are designated by the common numerals, and the explanation thereof is omitted.

The hard disk device 91 has a casing 21, a printed circuit board 25 contained inside the casing 21, a storage portion 92 for storing a plurality of disks, and a spindle motor 93 for rotating and driving the plurality of disks. The hard disk device 91 further has a bolt 26 for fixing the printed circuit board 25 on the casing 21. The printed wiring board 25 has the printed wiring board 31 and a plurality of circuit components disposed on the printed wiring board 31, though the illustration of the circuit components is omitted in FIG. 9.

The printed wiring board 31 is different from the second embodiment in that it has an opening portion 94 for disposing the spindle motor 93, but the other configuration is the same as the first embodiment. The substrate 33 of the printed wiring board 31 has one fixing hole 36 provided with the land 34 shaped like a sector around the periphery, and two through holes 42 provided with the second land 43 shaped like a doughnut around the periphery. The land 34 is the same as the land 34 of the first embodiment. The height adjuster 37 is formed of the solder resist, but may be formed of silk as in the first embodiment.

According to the fifth embodiment, even if the hard disk device 91 as one example of the electronic apparatus is used, the fixing hole 36 can be disposed as close to the edge 35 as possible. Therefore, it is possible to secure a wide mounting space on the printed wiring board 31. Also, since the height adjuster 37 has the same height as the land 34, the bolt 26 is not inclined and installed in fixing the printed wiring board 31 by fastening the bolt into the fixing hole. Therefore, the bolt 26 is not suspended over the land 34, whereby the printed wiring board 31 can be securely grounded.

Though the printed wiring board that is the same as the printed wiring board 31 of the first embodiment is employed in the fifth embodiment, it should be noted that the printed wiring board of the second to fourth embodiments may be alternatively employed.

The electronic apparatus of the invention is not limited to the portable computer 11 or the hard disk device 91, but may be any other electronic apparatus such as a cell phone, for example. Other various modifications can be made of the above-described electronic apparatus without departing from the spirit and scope of the invention.

What is claimed is:

1. A printed wiring board comprising:
   a substrate comprising a pair of edges and a fixing hole provided near the pair of edges;
   a land provided around the fixing hole at a first area excluding a second area between an edge of the substrate and the fixing hole, the land comprising an area extending from near the fixing hole toward a central portion of the substrate between directions toward which the pair of edges extends, and the land further comprising an edge that extends in a direction in parallel with an edge of the substrate; and
   a height adjusting portion comprising insulating property and a height substantially the same with that of the land and being positioned between the fixing hole and the pair of edges, the height adjusting portion abutting a head portion of a bolt at a position different from the land when the bolt is screwed through the fixing portion,
   wherein the land is shaped as a portion of an annular ring centered around the fixing hole and extending toward the central portion, wherein the radius of the inner circle of the annular ring is larger than the radius of the fixing hole, and wherein the height adjusting portion is formed on the substrate at a position within the annular ring that does not include the portion of the annular ring.

2. The printed wiring board of claim 1, wherein the height adjusting portion is provided at a position away from between the pair of edges and a portion of the land facing the pair of edges, the position at which the pair of edges intersect.

3. A printed wiring board comprising:
   a substrate comprising a single edge and a fixing hole provided near the single edge;
   a land provided around the fixing hole at a first area excluding a second area between an edge of the substrate and the fixing hole, the land comprising an area extending from near the fixing hole toward a central portion of the substrate between a direction from the fixing hole toward the central portion of the substrate and a direction toward which the single edge extends, and the land further comprising an edge that extends in a direction in parallel with an edge of the substrate; and
   a height adjusting portion comprising insulating property and a height substantially the same with that of the land and being positioned between the fixing hole and the single edge, the height adjusting portion abutting a head portion of a bolt at a position different from the land when the bolt is screwed through the fixing portion, wherein the land is shaped as a portion of an annular ring centered around the fixing hole and extending toward the central portion, wherein the radius of the inner circle of the annular ring is larger than the radius of the fixing hole, and wherein the height adjusting portion is formed on the substrate at a position within the annular ring that does not include the portion of the annular ring.

4. The printed wiring board of claim 3, wherein the height adjusting portion is provided at a position away from between the single edge and a portion of the land facing the single edge.

5. An electronic apparatus comprising:

a casing comprising a conductive ground layer on an inner surface;

a printed wiring board housed in the casing; and a bolt configured to fix the printed wiring board while grounding the printed wiring board to the conductive ground layer, wherein the printed wiring board comprises:

a substrate comprising a pair of edges and a fixing hole provided near the pair of edges;

a land provided around the fixing hole at a first area excluding a second area between an edge of the substrate and the fixing hole, the land comprising an area extending from near the fixing hole toward a central portion of the substrate between directions toward which the pair of edges extends, and the land further comprising an edge that extends in a direction in parallel with an edge of the substrate; and a height adjusting portion comprising insulating property and a height substantially the same with that of the land and being positioned between the fixing hole and the pair of edges, the height adjusting portion abutting a head portion of a bolt at a position different from the land when the bolt is screwed through the fixing portion, wherein the land is shaped as a portion of an annular ring centered around the fixing hole and extending toward the central portion, wherein the radius of the inner circle of the annular ring is larger than the radius of the fixing hole, and wherein the height adjusting portion is formed on the substrate at a position within the annular ring that does not include the portion of the annular ring.

6. An electronic apparatus comprising:

a casing comprising a conductive ground layer on an inner surface;

a printed wiring board housed in the casing; and a bolt configured to fix the printed wiring board while grounding the printed wiring board to the conductive ground layer, wherein the printed wiring board comprises:

a substrate comprising a single edge and a fixing hole provided near the single edge;

a land provided around the fixing hole at a first area excluding a second area between an edge of the substrate and the fixing hole, the land comprising an area extending from near the fixing hole toward a central portion of the substrate between a direction from the fixing hole toward the central portion of the substrate and a direction toward which the single edge extends, and the land further comprising an edge that extends in a direction in parallel with an edge of the substrate; and a height adjusting portion having insulating property and a height substantially the same with that of the land and being positioned between the fixing hole and the single edge, the height adjusting portion abutting a head portion of a bolt at a position different from the land when the bolt is screwed through the fixing portion, wherein the land is shaped as a portion of an annular ring centered around the fixing hole and extending toward the central portion, wherein the radius of the inner circle of the annular ring is larger than the radius of the fixing hole, and wherein the height adjusting portion is formed on the substrate at a position within the annular ring that does not include the portion of the annular ring.

7. A printed wiring board comprising:

a substrate comprising a pair of edges and a fixing hole provided near the pair of edges;

a land provided around the fixing hole at a first area excluding a second area between an edge of the substrate and the fixing hole, the land comprising an area extending from near the fixing hole toward a central portion of the substrate between directions toward which the pair of edges extends; and a height adjusting portion comprising insulating property and a height substantially the same with that of the land and being positioned between the fixing hole and the pair of edges, the height adjusting portion abutting a head portion of a bolt at a position different from the land when the bolt is screwed through the fixing portion, wherein the land is shaped as a portion of an annular ring centered around the fixing hole and extending toward the central portion, wherein the radius of the inner circle of the annular ring is larger than the radius of the fixing hole, and wherein the height adjusting portion is formed on the substrate at a position within the annular ring that does not include the portion of the annular ring.

8. A printed wiring board comprising:

a substrate comprising a pair of edges and a fixing hole provided near the pair of edges;

a land provided around the fixing hole, the land comprising an area extending from near the fixing hole toward a central portion of the substrate between directions toward which the pair of edges extends, and the land further comprising an edge that extends in a direction in parallel with an edge of the substrate; and a height adjusting portion comprising insulating property and a height substantially the same with that of the land and being positioned between the fixing hole and the pair of edges, the height adjusting portion abutting a head portion of a bolt at a position different from the land when the bolt is screwed through the fixing portion, wherein the land is shaped as a portion of an annular ring centered around the fixing hole and extending toward the central portion, wherein the radius of the inner circle of the annular ring is larger than the radius of the fixing hole, and wherein the height adjusting portion is formed on the substrate at a position within the annular ring that does not include the portion of the annular ring.

9. A printed wiring board comprising:

a substrate comprising a single edge and a fixing hole provided near the single edge;

a land provided around the fixing hole at a first area excluding a second area between an edge of the substrate and the fixing hole, the land comprising an area extending from near the fixing hole toward a central portion of the substrate between a direction from the fixing hole toward the central portion of the substrate and a direction toward which the single edge extends; and a height adjusting portion comprising insulating property and a height substantially the same with that of the land and being positioned between the fixing hole and the single edge, the height adjusting portion abutting a head portion of a bolt at a position different from the land when the bolt is screwed through the fixing portion, wherein the land is shaped as a portion of an annular ring centered around the fixing hole and extending toward the central portion, wherein the radius of the inner circle of the annular ring is larger than the radius of the fixing hole, and wherein the height adjusting portion is formed on the substrate at a position within the annular ring that does not include the portion of the annular ring.

10. A printed wiring board comprising:

a substrate comprising a single edge and a fixing hole provided near the single edge;

a land provided around the fixing hole, the land comprising an area extending from near the fixing hole toward a central portion of the substrate between a direction from the fixing hole toward the central portion of the substrate and a direction toward which the single edge extends, and the land further comprising an edge that extends in a direction in parallel with an edge of the substrate; and a height adjusting portion comprising insulating property and a height substantially the same with that of the land and being positioned between the fixing hole and the single edge, the height adjusting portion abutting a head portion of a bolt at a position different from the land when the bolt is screwed through the fixing portion, wherein the land is shaped as a portion of an annular ring centered around the fixing hole and extending toward the central portion, wherein the radius of the inner circle of the annular ring is larger than the radius of the fixing hole, and wherein the height adjusting portion is formed on the substrate at a position within the annular ring that does not include the portion of the annular ring.

11. An electronic apparatus comprising:

a casing comprising a conductive ground layer on an inner surface;

a printed wiring board housed in the casing; and a bolt configured to fix the printed wiring board while grounding the printed wiring board to the conductive ground layer, wherein the printed wiring board comprises:

a substrate comprising a pair of edges and a fixing hole provided near the pair of edges;

a land provided around the fixing hole at a first area excluding a second area between an edge of the substrate and the fixing hole, the land comprising an area extending from near the fixing hole toward a central portion of the substrate between directions toward which the pair of edges extends; and a height adjusting portion comprising insulating property and a height substantially the same with that of the land and being positioned between the fixing hole and the pair of edges, the height adjusting portion abutting a head portion of a bolt at a position different from the land when the bolt is screwed through the fixing portion, wherein the land is shaped as a portion of an annular ring centered around the fixing hole and extending toward the central portion, wherein the radius of the inner circle of the annular ring is larger than the radius of the fixing hole, and wherein the height adjusting portion is formed on the substrate at a position within the annular ring that does not include the portion of the annular ring.

12. An electronic apparatus comprising:

a casing comprising a conductive ground layer on an inner surface;

a printed wiring board housed in the casing; and a bolt configured to fix the printed wiring board while grounding the printed wiring board to the conductive ground layer, wherein the printed wiring board comprises:

a substrate comprising a pair of edges and a fixing hole provided near the pair of edges;

a land provided around the fixing hole, the land comprising an area extending from near the fixing hole toward a central portion of the substrate between directions toward which the pair of edges extends, and the land further comprising an edge that extends in a direction in parallel with an edge of the substrate; and a height adjusting portion comprising insulating property and a height substantially the same with that of the land and being positioned between the fixing hole and the pair of edges, the height adjusting portion abutting a head portion of a bolt at a position different from the land when the bolt is screwed through the fixing portion, wherein the land is shaped as a portion of an annular ring centered around the fixing hole and extending toward the central portion, wherein the radius of the inner circle of the annular ring is larger than the radius of the fixing hole, and wherein the height adjusting portion is formed on the substrate at a position within the annular ring that does not include the portion of the annular ring.

13. An electronic apparatus comprising:

a casing comprising a conductive ground layer on an inner surface;

a printed wiring board housed in the casing; and a bolt configured to fix the printed wiring board while grounding the printed wiring board to the conductive ground layer, wherein the printed wiring board comprises:

a substrate comprising a single edge and a fixing hole provided near the single edge;

a land provided around the fixing hole at a first area excluding a second area between an edge of the substrate and the fixing hole, the land comprising an area extending from near the fixing hole toward a central portion of the substrate between a direction from the fixing hole toward the central portion of the substrate and a direction toward which the single edge extends; and a height adjusting portion having insulating property and a height substantially the same with that of the land and being positioned between the fixing hole and the single edge, the height adjusting portion abutting a head portion of a bolt at a position different from the land when the bolt is screwed through the fixing portion, wherein the land is shaped as a portion of an annular ring centered around the fixing hole and extending toward the central portion, wherein the radius of the inner circle of the annular ring is larger than the radius of the fixing hole, and wherein the height adjusting portion is formed on the substrate at a position within the annular ring that does not include the portion of the annular ring.

14. An electronic apparatus comprising:

a casing comprising a conductive ground layer on an inner surface;

a printed wiring board housed in the casing; and a bolt configured to fix the printed wiring board while grounding the printed wiring board to the conductive ground layer, wherein the printed wiring board comprises:

a substrate comprising a single edge and a fixing hole provided near the single edge;

a land provided around the fixing hole, the land comprising an area extending from near the fixing hole toward a central portion of the substrate between a direction from the fixing hole toward the central portion of the substrate and a direction toward which the single edge extends, and the land further comprising an edge that extends in a direction in parallel with an edge of the substrate; and
a height adjusting portion having insulating property and a height substantially the same with that of the land and being positioned between the fixing hole and the single edge, the height adjusting portion abutting a head portion of a bolt at a position different from the land when the bolt is screwed through the fixing portion,
wherein the land is shaped as a portion of an annular ring centered around the fixing hole and extending toward the central portion, wherein the radius of the inner circle of the annular ring is larger than the radius of the fixing hole, and wherein the height adjusting portion is formed on the substrate at a position within the annular ring that does not include the portion of the annular ring.

* * * * *